US009589076B2

(12) United States Patent
Ferrier et al.

(10) Patent No.: US 9,589,076 B2
(45) Date of Patent: Mar. 7, 2017

(54) AREA-BASED OPEN PIT MINE DESIGNER

(71) Applicant: Trimble Navigation Limited, Sunnyvale, CA (US)

(72) Inventors: Adrian Ferrier, Atlanta, GA (US); Juan Carlos Santamaria, Suwanee, GA (US); Augusto Opdenbosch, Alpharetta, GA (US); Mitch Altman, Roswell, GA (US)

(73) Assignee: Trimble Inc., Sunnyvale, CA (US)

( * ) Notice: Subject to any disclaimer, the term of this patent is extended or adjusted under 35 U.S.C. 154(b) by 450 days.

(21) Appl. No.: 13/827,461

(22) Filed: Mar. 14, 2013

(65) Prior Publication Data
US 2013/0262046 A1 Oct. 3, 2013

Related U.S. Application Data

(63) Continuation-in-part of application No. 13/827,239, filed on Mar. 14, 2013.

(60) Provisional application No. 61/616,868, filed on Mar. 28, 2012.

(51) Int. Cl.
*G06F 17/50* (2006.01)
*E21C 41/26* (2006.01)

(52) U.S. Cl.
CPC .............. *G06F 17/50* (2013.01); *E21C 41/26* (2013.01); *G06F 17/5004* (2013.01)

(58) Field of Classification Search
CPC ....... E21C 41/26; G06F 17/50; G06F 17/5004
See application file for complete search history.

(56) References Cited

U.S. PATENT DOCUMENTS

| 5,178,226 A * | 1/1993 | Bowman | B65F 3/04 |
| | | | 177/139 |
| 5,631,658 A * | 5/1997 | Gudat | A01B 79/005 |
| | | | 342/357.31 |
| 7,519,515 B2 | 4/2009 | Froyland et al. | |
| 7,957,941 B2 | 6/2011 | Froyland et al. | |
| 8,103,364 B2 | 1/2012 | Zuckerberg et al. | |
| 2006/0100722 A1 | 5/2006 | Bell et al. | |
| 2006/0190219 A1* | 8/2006 | Froyland et al. | 703/1 |

(Continued)

FOREIGN PATENT DOCUMENTS

WO 2004/033854 A1 4/2004
WO 2006/108213 A1 10/2006

(Continued)

OTHER PUBLICATIONS

W. Hustrulid et al., "Open Pit Mine Planning & Design," 2nd Edition, vols. 1 and 2, 2006, Taylor & Francis, pp. 46-643, 737-869.*

(Continued)

*Primary Examiner* — Aniss Chad
*Assistant Examiner* — Russ Guill
(74) *Attorney, Agent, or Firm* — Kilpatrick Townsend & Stockton LLP

(57) ABSTRACT

An area-based open pit mine designer is disclosed. One example includes an economic shell receiver module to receive an economic shell. In addition, a user input module receives a user parametric input denoting an open pit mine shape based on the economic shell. The open pit mine designer module automatically develops an open pit mine design based on the user parametric input.

14 Claims, 11 Drawing Sheets

(56) References Cited

U.S. PATENT DOCUMENTS

| | | |
|---|---|---|
| 2008/0290718 A1 | 11/2008 | Zukerberg et al. |
| 2009/0125283 A1 | 5/2009 | Conover |
| 2009/0306942 A1 | 12/2009 | Froyland et al. |
| 2011/0191069 A1 | 8/2011 | Madsen et al. |
| 2011/0299730 A1 | 12/2011 | Elinas et al. |
| 2012/0046818 A1 | 2/2012 | Nettleton et al. |
| 2013/0262045 A1 | 10/2013 | Darby et al. |
| 2013/0262047 A1 | 10/2013 | Darby et al. |

FOREIGN PATENT DOCUMENTS

| | | |
|---|---|---|
| WO | 2009119960 | 10/2009 |
| WO | 2010/124338 A1 | 11/2010 |

OTHER PUBLICATIONS

Louis Caccetta, "Application of optimization techniques in open pit mining," 2007, in "Handbook of Operations Research in Natural Resources," by Andres Weintraub et al., 2007, Springer, pp. 547-559.*

Daniel R. Hack, "Comparison of Commercial Mine Planning Packages Available to the Aggregate Industry," 2002, APCOM 2002—Application of Computers and Operations Research in the Minerals Industry, pp. 1-9.*

R. M. Kear et al., "Split shell open pit design concept applied at de beers venetia mine south Africa using the whittle and gemcom software," Mar. 2001, Strategic Mine Planning Conference, Perth, WA, pp. 121-128.*

"Gemcom Minex Geology and Mine Planning for Stratified Deposits," 2012, Gemcom Software International Inc., four pages.*

"Carlson Software 2013," May 22, 2012, Carlson Software, Inc., 3502 pages.*

T. D. Sullivan, "Pit slope design and risk-a view of the current state of the art," 2006, International Symposium on Stability of Rock Slopes in Open Pit Mining and Civil Engineering, 30 pages.*

"International Search Report PCT/2013/034190", 16 Pages, Jul. 29, 2013.

Dirkse, "How to Create a Multi-Level House in a Sweet Home 3D", Hans Dirkse, 2010, 1-11.

Extended European Search Report for Application No. 13767682.1, dated Nov. 17, 2015, 7 pages.

Dump design and management, International Mining, Feb. 2009, pp. 45-47.

U.S. Appl. No. 13/827,239, Final Office Action mailed on Jul. 27, 2016, 23 pages.

U.S. Appl. No. 13/827,239, Final Office Action mailed on Oct. 6, 2015, 31 pages.

U.S. Appl. No. 13/827,239, Non-Final Office Action mailed on May 18, 2015, 25 pages.

U.S. Appl. No. 13/827,239, Non-Final Office Action mailed on Apr. 29, 2016, 27 pages.

U.S. Appl. No. 13/829,804, Final Office Action mailed on Nov. 5, 2015, 43 pages.

U.S. Appl. No. 13/829,804, Non-Final Office Action mailed on May 18, 2015, 33 pages.

U.S. Appl. No. 13/829,804, Non-Final Office Action mailed on Apr. 15, 2016, 34 pages.

U.S. Appl. No. 13/829,804, Notice of Allowance mailed on Sep. 13, 2016, 8 pages.

Dincer, Application of pit optimization algorithms beyond open pit limits, 17th International Mining Congress and Exhibition of Turkey, 2001, pp. 549-556.

* cited by examiner

AREA-BASED OPEN PIT MINE DESIGNER

CROSS REFERENCE TO RELATED U.S. APPLICATIONS

This application claims priority to and benefit of co-pending U.S. Provisional Patent Application Ser. No. 61/616,868, entitled "MINE OPTIMIZATION," by George Derrick Darby, Jr., with a filing date of Mar. 28, 2012, and assigned to the assignee of the present application.

This application is related to co-pending U.S. patent application Ser. No. 13/827,239, entitled "OPEN PIT MINE DESIGNER," by Darby et al., with a filing date of Dec. 17 2009, and assigned to the assignee of the present application.

This application is related to co-pending U.S. patent application Ser. No. 13/829,804, entitled "AUTOMATIC CHANGE PROPAGATION IN AN AREA-BASED OPEN PIT MINE DESIGNER," by Ferrier et al., with a filing date of Mar. 14, 2013, and assigned to the assignee of the present application.

BACKGROUND

Open pit mines are one of a plurality of types of mines that can be used to extract ore from the Earth. However, instead of using tunnels or other types of underground extraction processes, open pit mines remain open to the environment. They may also be known as surface mines.

BRIEF DESCRIPTION OF THE DRAWINGS

The accompanying drawings, which are incorporated in and form a part of this application, illustrate and serve to explain the principles of embodiments in conjunction with the description. Unless noted, the drawings referred to this description should be understood as not being drawn to scale.

DESCRIPTION OF EMBODIMENT(S)

Reference will now be made in detail to various embodiments of the present technology, examples of which are illustrated in the accompanying drawings. While the present technology will be described in conjunction with these embodiments, it will be understood that they are not intended to limit the present technology to these embodiments. On the contrary, the present technology is intended to cover alternatives, modifications and equivalents, which may be included within the spirit and scope of the present technology as defined by the appended claims. Furthermore, in the following description of the present technology, numerous specific details are set forth in order to provide a thorough understanding of the present technology. In other instances, well-known methods, procedures, components, and circuits have not been described in detail as not to unnecessarily obscure aspects of the present technology.

Unless specifically stated otherwise as apparent from the following discussions, it is appreciated that throughout the present description of embodiments, discussions utilizing terms such as "receiving", "storing", "generating", "transmitting", "inferring," or the like, refer to the actions and processes of a computer system, or similar electronic computing device. The computer system or similar electronic computing device manipulates and transforms data represented as physical (electronic) quantities within the computer system's registers and memories into other data similarly represented as physical quantities within the computer system memories or registers or other such information storage, transmission, or display devices. Embodiments of the present technology are also well suited to the use of other computer systems such as, for example, mobile communication devices.

Overview

Embodiments of the present invention enable the automatic and efficient generation of an open pit mine design. In the following discussion, the automated open pit mine design develops an open pit mine design that utilizes a least amount of waste removal criterion while retrieving a majority of the ore delineated by the economic model. That is, the open pit mine designer provides a design that results in the least amount of waste needing to be removed while recovering approximately all of the ore delineated by the economic model.

In other words, any moved earth is purely a cost factor to the mine. Therefore, by utilizing the open pit mine designer described herein to plan a mine that requires less earth/waste removal to obtain the same amount of ore, the mine will make the same amount of money, e.g., acquired ore, while reducing the ancillary costs of waste removal, and enforcing the engineering constraints to ensure sufficient structural integrity of the bench walls and allowing efficient routes for earthmoving equipment.

Figure 1A:
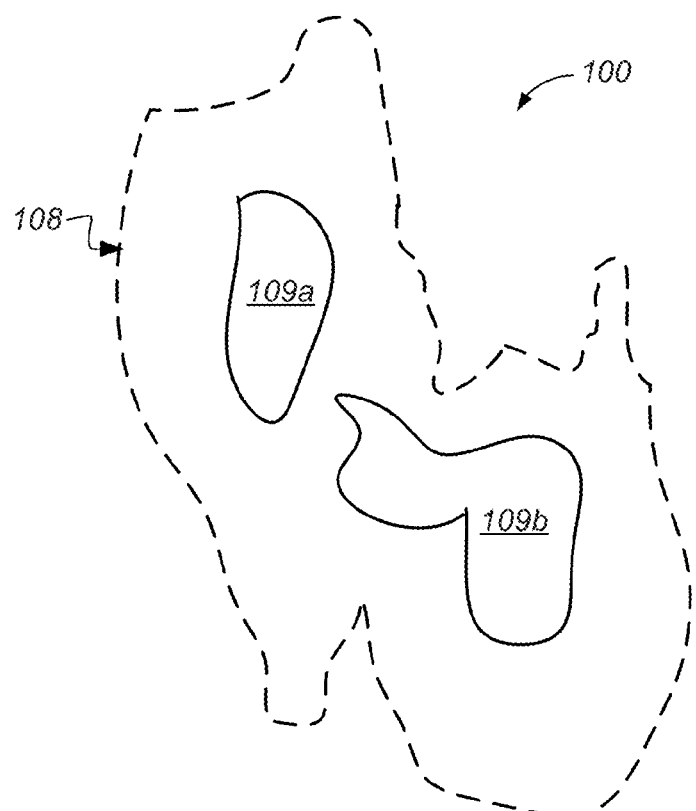
FIG. 1A is a diagram of an economic shell of an open pit mine according to one embodiment of the present technology.

With reference now to FIG. 1A, a diagram 100 of an economic shell 108 of an open pit mine is shown in accordance with one embodiment. For purposes of the present discussion, the economic shell 108 provides a perfect world open pit mine design. In other words, the economic shell 108 only notes the type of ore deposits 109a, 109*b*, the ore deposit locations and a standardized slope for achieving the open pit design. Thus, the economic shell 108 illustrates what an open pit mine would look like if the ore and waste was removed without concern of how the actual ore and waste removal occurred. For example, the economic shell usually does not include haul roads, engineering criteria, geological information used to determine the actual slope, or the like.

Figure 1B:
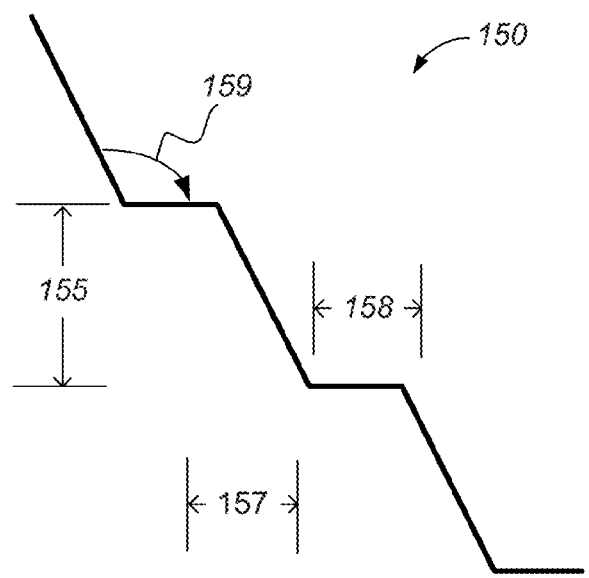
FIG. 1B is a graphical representation of slope information according to one embodiment of the present technology.

Referring now to FIG. 1B, a graphical representation of slope information 150 is shown in accordance with an embodiment. In general, the slope information 150 includes bench height 155, berm width 157, ramp width 158 and slope angle 159.

Figure 1C:
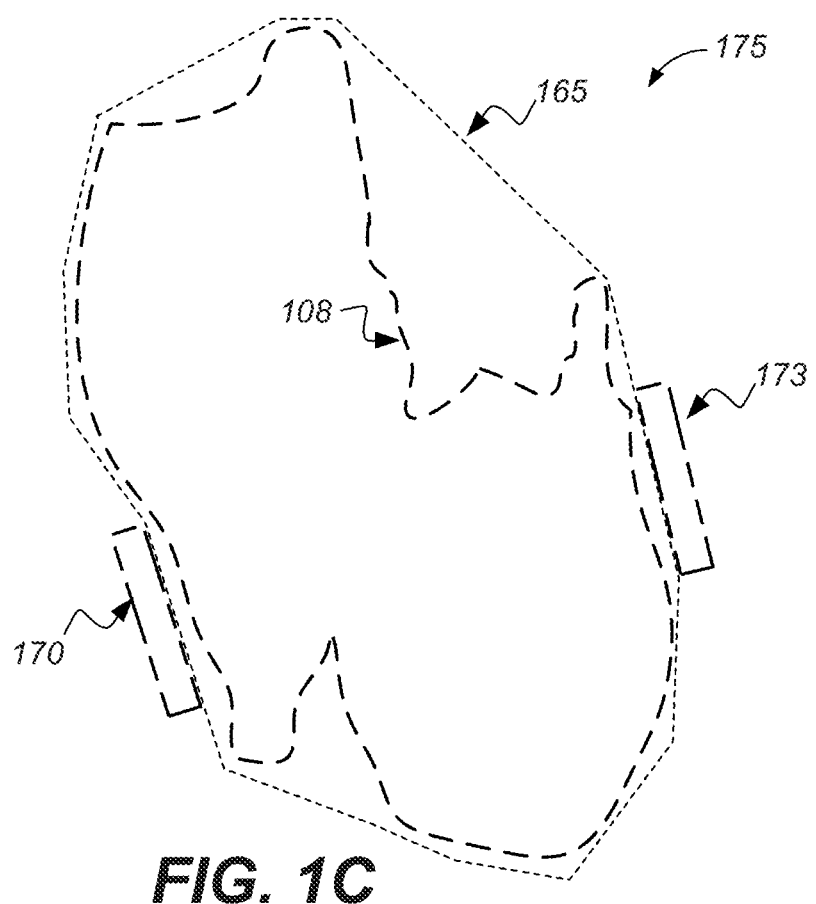
FIG. 1C is a plan view for one elevation level of an open pit mine design according to one embodiment of the present technology.

With reference now to FIG. 1C, a plan view for one elevation level of an open pit mine plan 175 is shown in accordance with one embodiment. Elevation cross-section mine plan 175 includes economic shell 108, actual pit perimeter 165, a portion of a waste haul road 170 and a portion of an ore haul road 173.

In general, the elevation level refers to a cross-section for the open pit mine design at a given elevation. For example, if the open pit mine economic shell 108 includes an elevation range of 300 meters, that is, the bottom of the mine is 300 meters below the top of the mine, the cross-section 175 would include only a specific elevation, e.g., 150 meters. For example, in one embodiment if bench height 155 is 15 meters there may be 20 cross-sections 175 for an open pit mine design having a desired depth of 300 meters. In another embodiment, the number of cross-sections for the mine design may be based on other metrics such as those discussed herein.

Figure 1D:
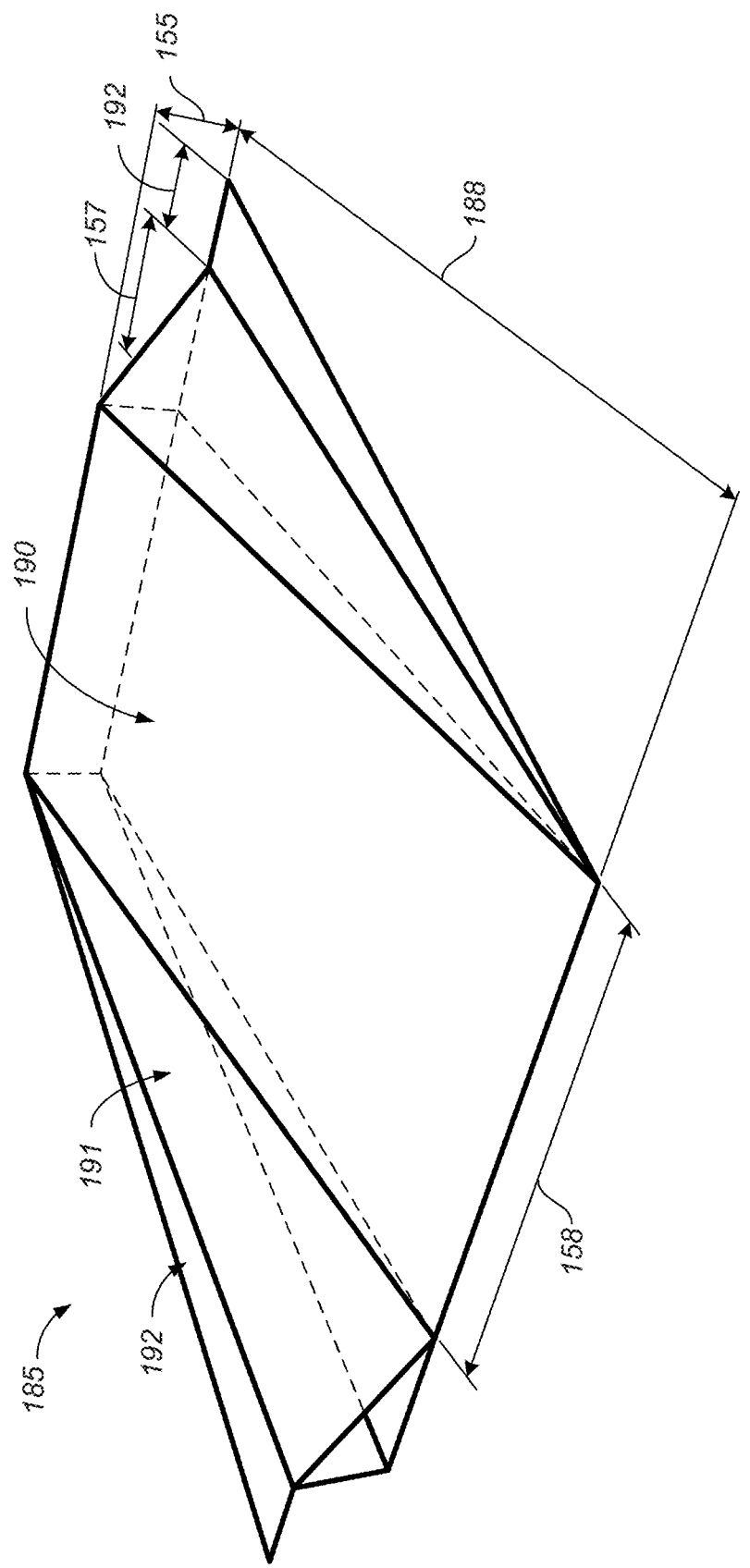
FIG. 1D is a diagram of a ramp construct for a given elevation according to one embodiment of the present technology.

With reference now to FIG. 1D, a ramp construct 185 for a portion of road 190 for a given elevation is shown according to one embodiment. That is, in conjunction with the cross section for each section of the mine pit as shown in FIG. 1C, a ramp construct 185 is determined Although only one ramp construct 185 is shown, in one embodiment, multiple ramp constructs 185 may be utilized for each cross-section of elevation to support independent transportation of material, for example, ore haul roads and waste hauling roads. In one embodiment the length 188 of the ramp construct road 190 is determined by the height 155 of the cross-section in conjunction with the determined road grade slope.

For example, if the bench height 155 is 15 meters and the road grade is determined to be 10%, then the length 188 for the ramp construct portion 185 would be 150 meters. In one embodiment, ramp construct 185 may additionally utilize information, such as but not limited to, a stack height, e.g., a number of benches 192, a stack slope 191: based on material failure; a step out width and a switchback haul road-to reach a location without going around the pit.

With reference now to both FIGS. 1C and 1D, in one embodiment, the location of ramp construct 185 (e.g., haul roads 170 and 173) for each level are picked at the elevation chosen in a prior level and are sloped in an appropriate direction based on whether the road 190 is moving up or down. For example, the haul road boxes 170 and 173 shown in further detail in ramp construct 185 are moved up in the direction of the surface and go to the crest string. A surface elevation tie in is used to ensure that each of the prior ramp construct 185 surfaces smoothly meet the next levels ramp construct 185 surfaces in the correct direction and location.

Figure 1E:
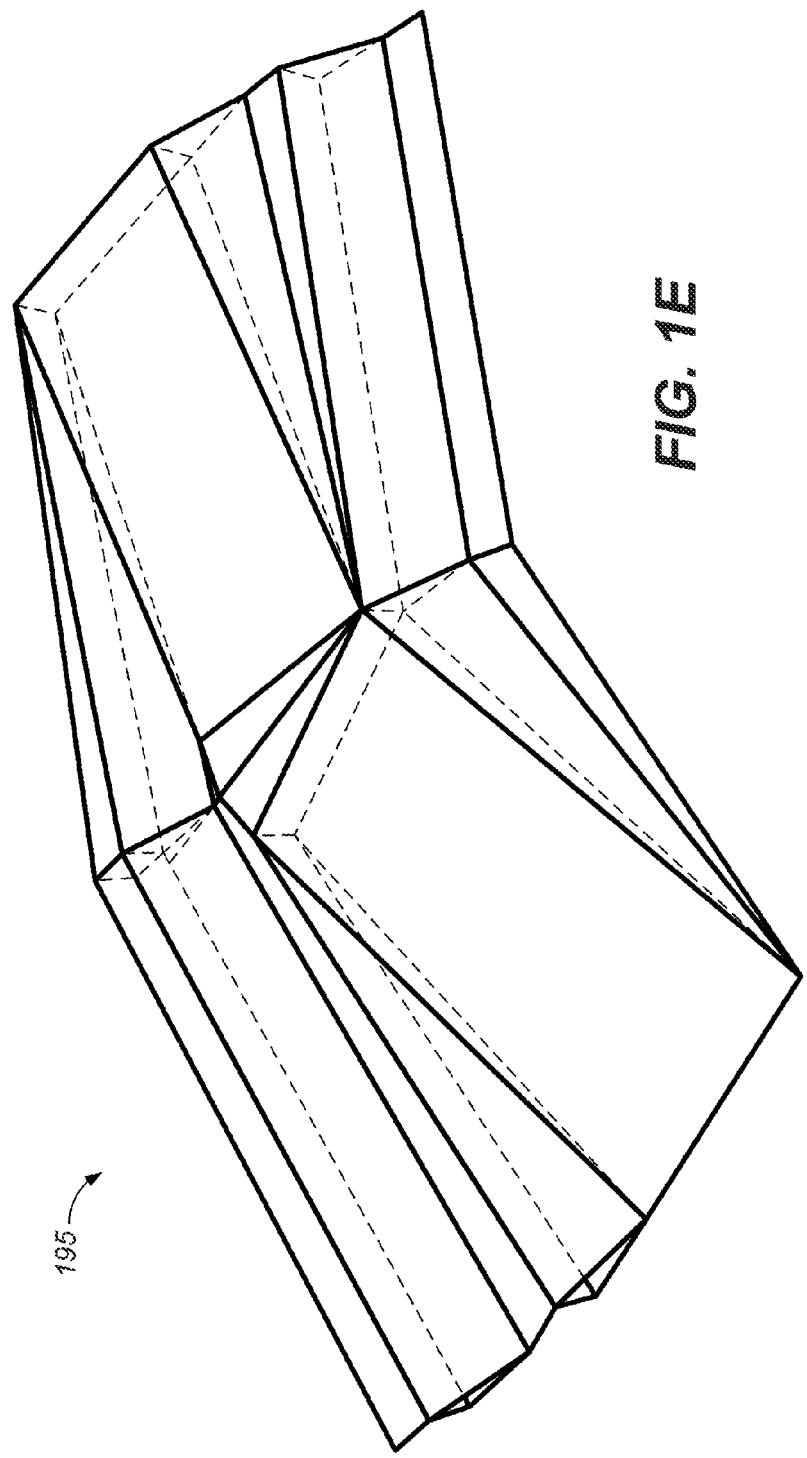
FIG. 1E is a diagram of a convex turn according to one embodiment of the present technology.
Figure 1F:
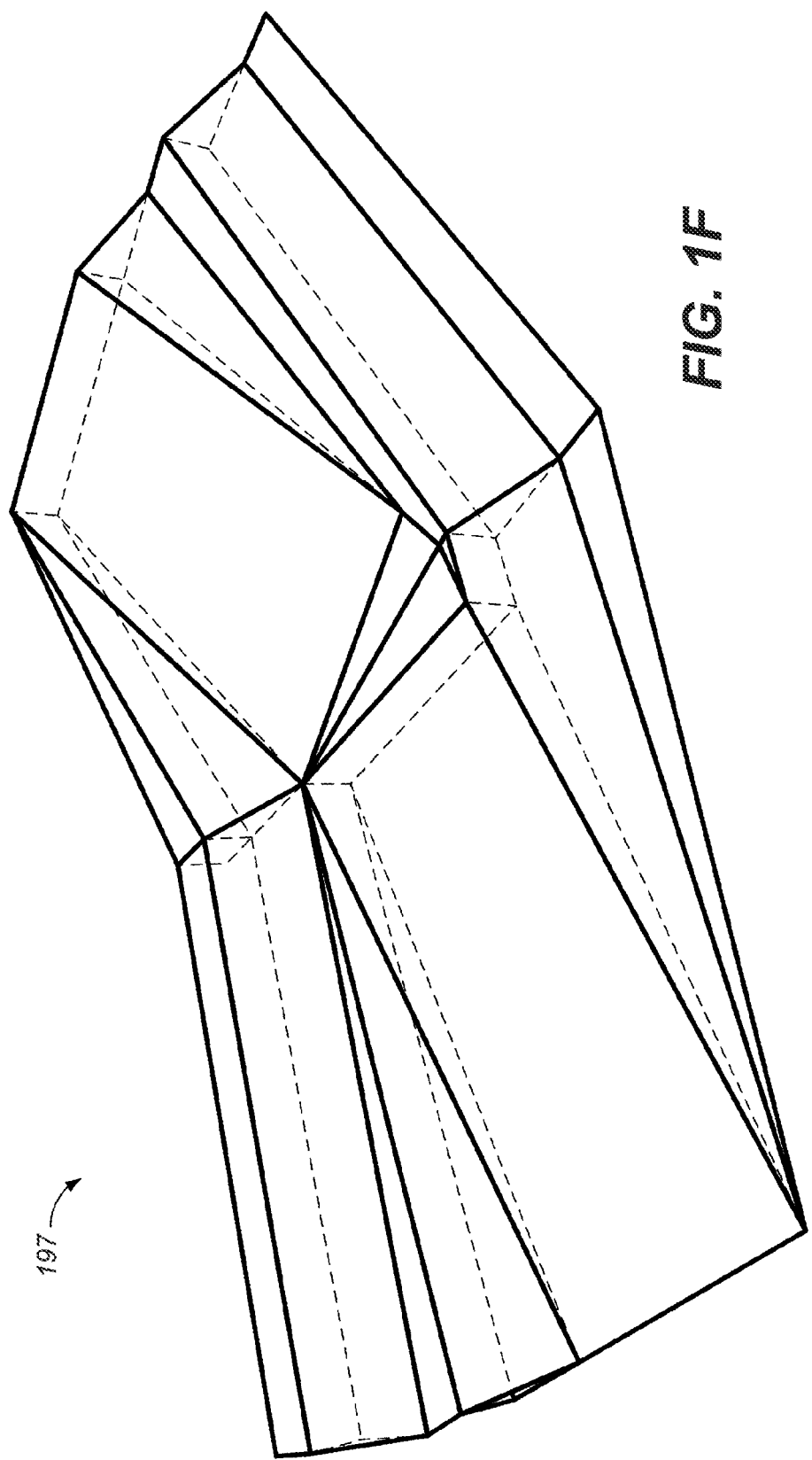
FIG. 1F is a diagram of a concave turn according to one embodiment of the present technology.

With reference now to FIG. 1E, an embodiment of a convex turn 195 is shown. In FIG. 1F, an embodiment of a concave turn 197 is shown. In general, the turns 195 and 197 illustrate two embodiments of turns being implemented between two of the layers shown in FIGS. 1C and 1D.

Figure 2:
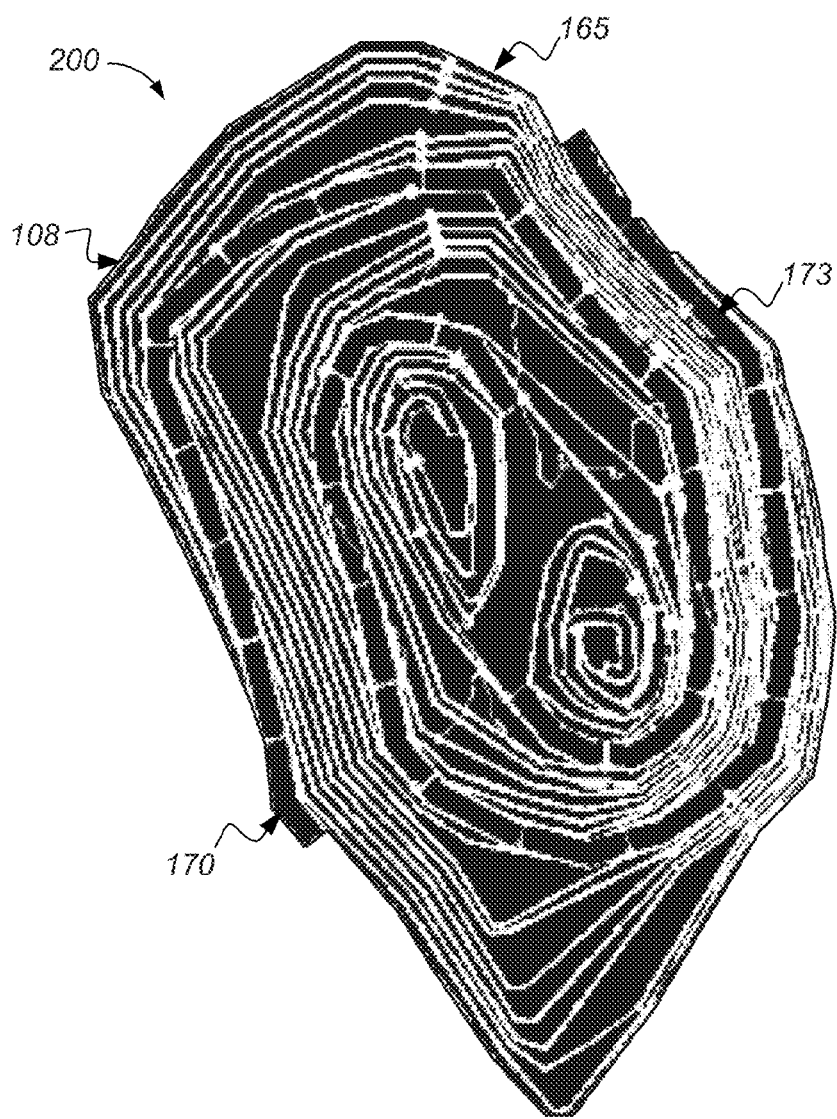
FIG. 2 is diagram of a completed open pit mine design according to one embodiment of the present technology.

With reference now to FIG. 2, one version of a completed open pit mine design 200 is shown. Open pit mine design 200 includes the pit design 165, ore haul road 173 and waste haul road 170 ramp constructs 185 for every layer overlaid on the economic shell 108. In one embodiment, a color code may be utilized to show positive and negative areas within the open pit mine design 200 and to provide recommendations about open pit mine design modifications. In addition, color may be used in a per ore block basis to describe the type or types of minerals within an ore block, an actual cost of removing the ore block, and the like.

Figure 3:
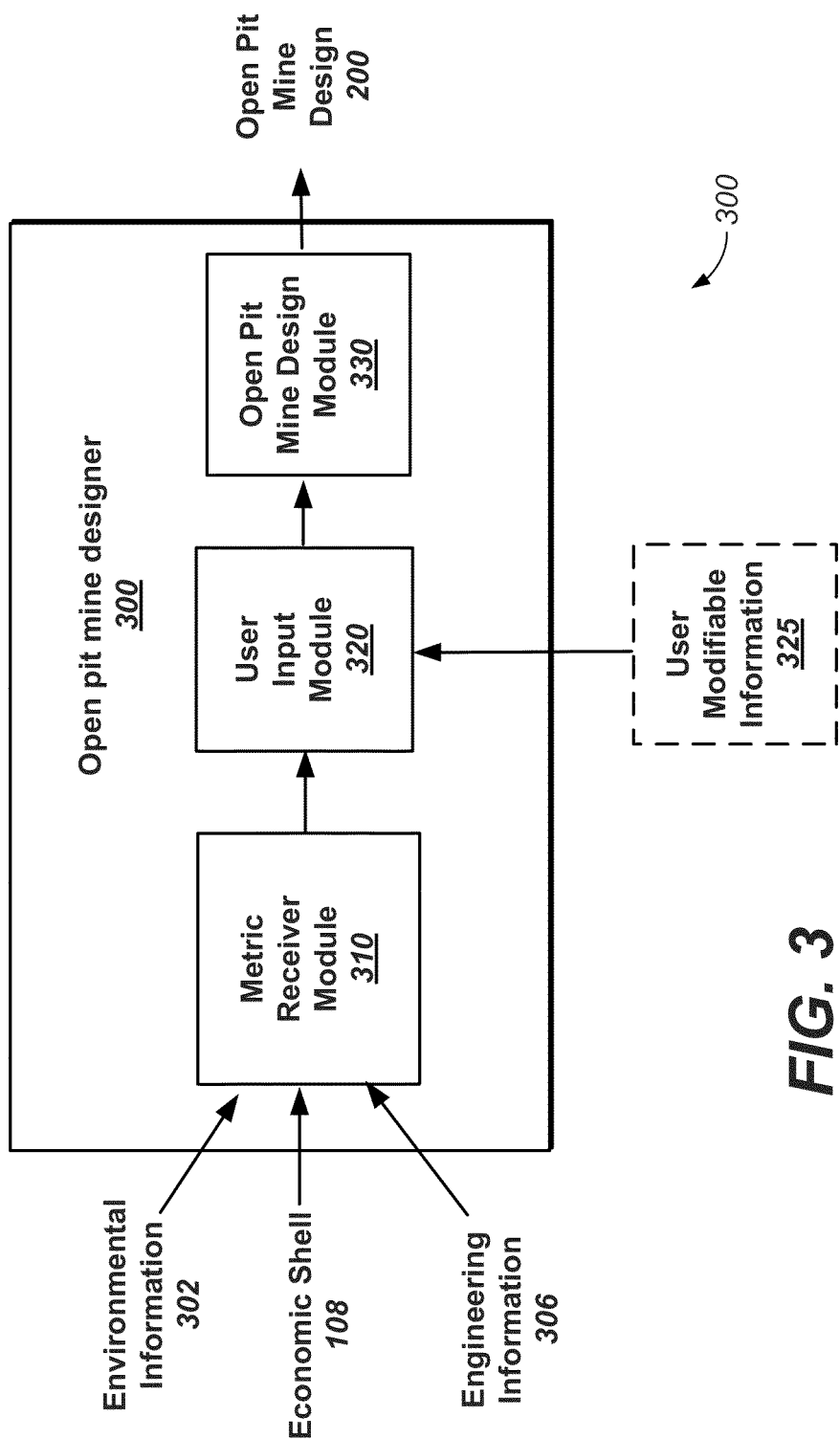
FIG. 3 is an open pit mine designer according to one embodiment of the present technology.

With reference now to FIG. 3, an open pit mine designer 300 is shown in accordance with an embodiment of the present technology. In one embodiment, open pit mine designer 300 includes metric receiver module 310, user input module 320 and open pit mine designer module 330.

As shown in FIG. 3, metric receiver module 310 receives input metrics such as environmental information 302, economic shell information 108 and engineering information 306. In general, environmental information 302 includes geological information about material around the ore, information such as a mineral type of the ore, a quantity of the ore and a value of the ore, as well as waste dump locations, ore drop locations and the like. Engineering information 306 may include vehicle availability, truck parameters, truck geometry and vehicle capability characteristics and the like.

In one embodiment, metric receiver module 310 provides the received information to user input module 320. User input module 320 may optionally receive additional input from user modifiable information 325. In general, user modifiable information 325 may include information related to user adjustments such as ore retrieval ranking, mining timeline information, vehicle availability, fuel availability, dump location changes, updated geological information and the like.

User input module 320 provides the information from metric receiver module 310 and any user modifiable information 325 to open pit mine designer module 330. In one embodiment, open pit mine designer module 330 utilizes the input to develop an open pit mine design 200 with underlying criteria to develop a design with the least amount of waste that needs to be removed to obtain the ore delineated in the economic model.

Open Pit Mine Design

Figure 4A:
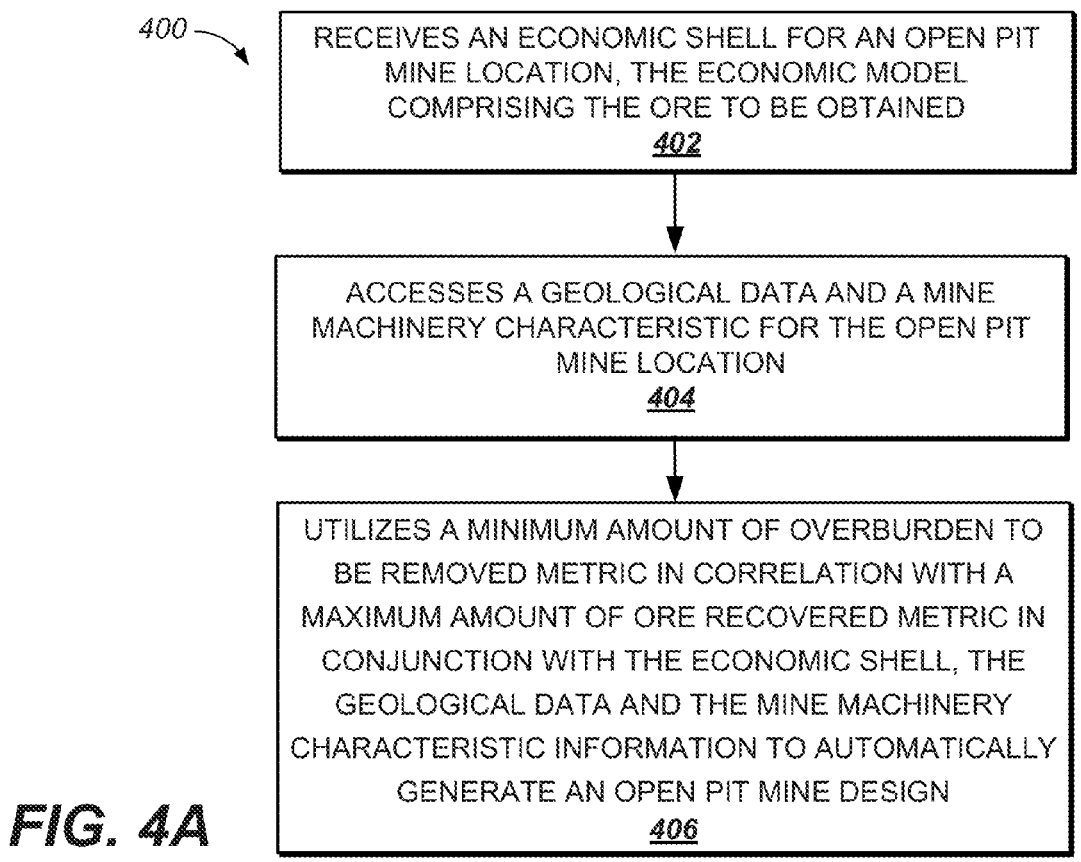
FIG. 4A is a flowchart of a method for automatically generating an open pit mine design according to one embodiment of the present technology.

With reference now to FIG. 4A, a flowchart 400 of a method for designing an open pit mine is shown in accordance with one embodiment of the present technology. That is, by planning a mine that requires less earth/waste removal to obtain the same amount of ore, the open pit mine makes the same amount of money, e.g., acquired ore, while reducing the ancillary costs of waste removal.

Referring now to 402 of FIG. 4A and FIG. 1A, one embodiment receives an economic shell 108 for an open pit mine location, the economic shell 108 including the locations of the ore to be obtained.

With reference now to 404 of FIG. 4A and FIG. 1B, one embodiment accesses a geological data and mine machinery characteristic for the open pit mine location. For example, the geological data may include soil type, consistency, and the like. In addition, a mine machinery characteristic may include vehicle parameters such as, but not limited to, width, length, empty weight, operating machine weight, maximum weight, capacity, front and rear weight distribution for empty and loaded conditions, tire size, net power, gross power, width of the truck, maximum grade slope, turning radius, fuel consumption and the like.

As described herein, the geological information in conjunction with the vehicle characteristics is utilized to determine the slope information 150. In one embodiment, the slope information 150 may additionally utilize one or more default characteristics or design specific criteria. For example, the haul road ramp width 158 may be determined by a default of approximately 3.5 times the width of the widest truck to allow passing between ascending and descending vehicles. In another embodiment, such as close pits, the haul road ramp width 158 may use a single width road default width. In one embodiment, the maximum grade slope may be a 10% default. Although a number of defaults values are provided herein, the default values are representative of one embodiment and may be adjusted in different implementations.

With reference now to 406 of FIG. 4A and FIGS. 2-3, one embodiment utilizes a minimum amount of waste to be removed metric in correlation with a maximum amount of ore recovered metric in conjunction with the economic shell, the geological data and the mine machinery characteristic information to automatically generate an open pit mine design.

In other words, one embodiment automatically generates the open pit mine design based on the least amount of waste to be removed while obtaining a majority of the ore delineated by the economic model 108. For example, one degree of slope of road, over the life of the mine, may be worth millions or billions of dollars in waste removal costs.

In general, open pit mine designer module 330 develops a number of elevation cross section layers 175 such as shown in FIG. 1C and then links each of the layers 175 to generate the open pit mine design 200. By developing the open pit mine design 200 as a number of specific layers and then linking the layers, the open pit mine designer 300 is capable of iterating the mine design multiple times and for a number of adjustable metrics. In so doing, the mine design can be evaluated with respect to a number of different adjustable metrics, re-evaluated and updated across the life of the mine For example, in one embodiment, open pit mine designer 300 may make recommendations as to which vehicles may be used. For example, the open pit mine design 200 iteration can be performed for different trucks with different geometries (weight restrictions, slope restrictions, etc.) to provide a metric based evaluation for the best truck for the job thereby incurring further cost savings.

For example, by utilizing a smaller truck the resultant design would have a narrower ramp width 158, lower weight restrictions, lower slope restrictions, or the like which could reduce the amount of waste to be removed. Conversely, utilizing larger trucks would require a wider ramp width 158, higher weight restrictions and higher slope restrictions which may increase the waste to be removed, but the increase in waste may be offset by the time savings generated by the increased load capabilities.

In another embodiment, the open pit mine design 200 may be revisited throughout the actual life of the mine as user modifiable information 325 is provided. One example of user adjustable criteria is the order in which the ore should be retrieved in a mixed ore mine.

For example, if a mine has a number of different ores, e.g., gold, platinum, and the like, the initial design may have been made without an initial emphasis on which ore was the higher priority but instead on the most efficient way of removing the ore. In another embodiment, the initial design may have been predicated on removing one ore in a more expedient fashion. For example, the gold may have been a primary focus due to a high gold price point.

However, in a changing market environment, such as during the time of the mine planning and the extraction process, the market may begin to show an exponential increase in the value of platinum while the gold price may be rising linearly or even becoming stagnant. As such, it would be in the extractor's best interest to adjust the mine plan to focus on extracting the platinum.

Utilizing the tools described herein, one embodiment allows a mine plan to be adjusted, or redesigned, by adjusting an existing metric or adding a new metric and then performing a mine plan redesign. For instance, in the above example, the metric that is changed is the value of the extracted ore or the importance of the ore to be extracted. In other words, whereas the previous mine design either did not place an emphasis on the extraction of one ore over another or focused on the extraction of the gold over the extraction of the platinum, the mine redesign will adjust a mine design metric to place a priority on the extraction of platinum.

In another example, the mine may be a mine that was planned according to a sampling of the platinum and gold materials in the mine Thus, a mine with a large gold ore potential and a smaller platinum ore potential is planned with an emphasis on reaching one or more of the larger gold deposits first. However, once the gold ore is reached, for any number of reasons, it may be realized that the gold ore is not as high of a quality as initially expected. As such, the mine owners may want to change the emphasis from the gold ore to the platinum ore, thus requiring a redesign of the mine plan.

By adjusting the metric of priority as to which ore should be extracted first, the mine plan would be redesigned. In addition, the redesign would also include any changes that have been made to the area since the open pit mining had begun. For example, initially reaching the gold ore may have included the construction of haul roads, a waste storage/disposal location and a change in the topography of the mined landscape. In one embodiment, each of these metrics is also adjusted, added to, or otherwise accounted for in the open pit design during the development of the redesigned plan. Therefore, when the emphasis changes from gold to platinum, the redesigned plan not only incorporates the changes needed to access the ore, but the open pit mine designer 300 also accounts for the existing haul roads, location of the waste storage/disposal and other established metrics while updating the open pit mine design.

Figure 4B:
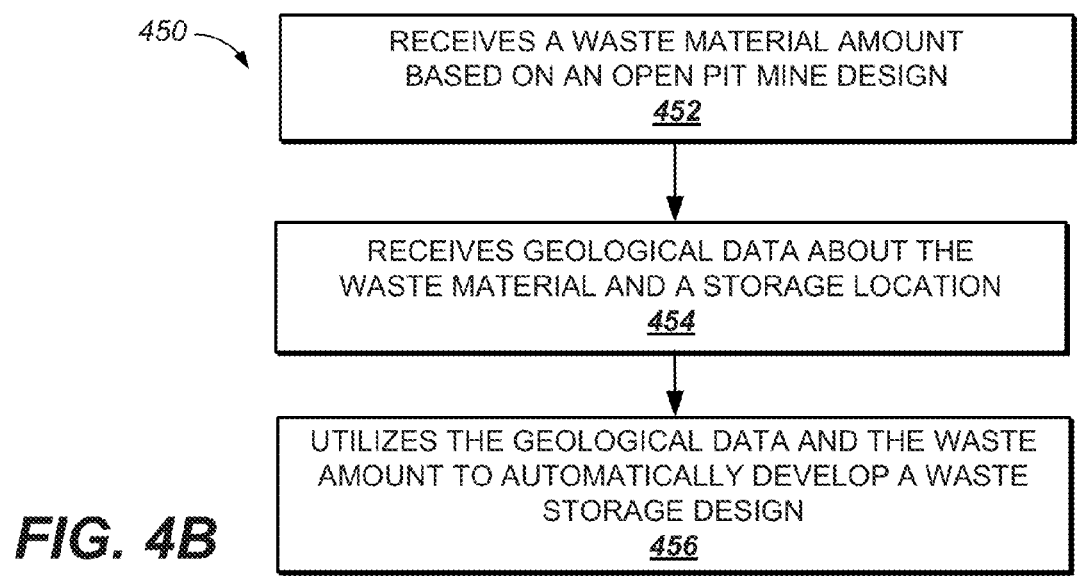
FIG. 4B is a flowchart of a method for automatically generating a waste storage design according to one embodiment of the present technology.

With reference now to FIG. 4B, a flowchart 450 of a method for automatically developing a waste storage design is shown in accordance with one embodiment of the present technology. That is, utilizing the same basic functionality described herein, a waste storage design can be automatically developed based on the amount of waste to be removed in the mine design.

Referring now to 452 of FIG. 4B and FIG. 1A, one embodiment receives a waste material amount based on the open pit mine design. The waste material amount being a measure of the waste material that planned to be removed during the design of the open pit mine With reference now to 454 of FIG. 4B and FIG. 1B, one embodiment receives geological data about the waste material as well as a storage location. For example, the waste geological data may include waste material type, consistency, and the like. In addition, storage location information may include environmental parameters such as, but not limited to: storage area fitment requirements such as length of waste pile, width of waste pile and height of waste pile; environmental impact information such as run-off areas, wildlife areas, off-limit areas; geographical information including hills, valleys and waterways; and the like.

Similarly, vehicle characteristics that will be delivering the waste may be used with waste geological information to determine the slope information for the waste pile. In general, the waste storage design is an inverse of the mine design 150. Thus, the same characteristics that were utilized in developing the mine design are also used to develop the waste storage design, e.g., bench height, berm width, slope angle, ramp width and the like.

For example, the haul road ramp width 158 may be determined by a default of approximately 3.5 times the width of the widest truck to allow passing between ascending and descending vehicles. In one embodiment, the maximum grade slope may be a 10% default. Although a number of defaults values are provided herein, the default values are representative of one embodiment and may be adjusted in different implementations. Moreover, although all of the mine design characteristics are not repeated in the waste design description, any or all of the design characteristics that are applicable to the mine design may be similarly utilized during the waste storage design.

With reference now to 456 of FIG. 4B and FIGS. 2-3, one embodiment utilizes the geological data and the waste amount to automatically develop a waste storage design. For example, one embodiment automatically generates the waste storage design based on the waste information delineated by the open pit mine design. Thus, in one embodiment both the open pit mine design and the waste storage design may be generated and provided to the user at almost the same time.

Similarly, any modifications to the open pit mine design may be automatically carried over to the waste storage design. For example, if an increase in the size of the open pit mine design was contemplated, the user would be able to review the associated waste storage design. This information may be economically important if the adjustment to the open pit mine design resulted in a need for a secondary waste storage location or an adjustment to the waste storage design that would require additional permissions, or the like.

Area-Based Mine Design

Figure 5:
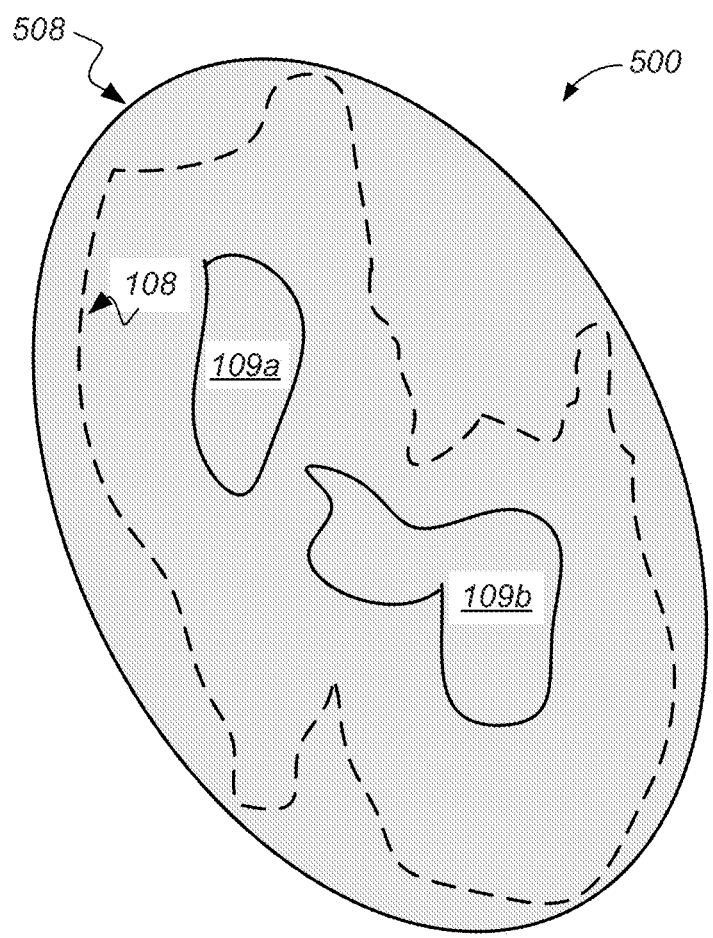
FIG. 5 is an area-based open pit mine design shown in accordance with one embodiment of the present technology.

With reference now to FIG. 5, an area-based open pit mine design 500 is shown in accordance with one embodiment. In general, area-based open pit mine design refers to the user level interaction with the open pit mine designer 300. For example, suppose a user wants to develop a mine design based on diagram 100 of the economic shell 108 described in FIG. 1A. By utilizing an area-based or parametric design method and system, instead of providing a level by level line and point design, the user paints or otherwise indicates the open pit mine shape 508 over the economic shell 108. The open pit mine designer 300 then automatically generates the open pit mine design level by level and point to point based on the shape 508 indicated by the user.

Figure 6A:
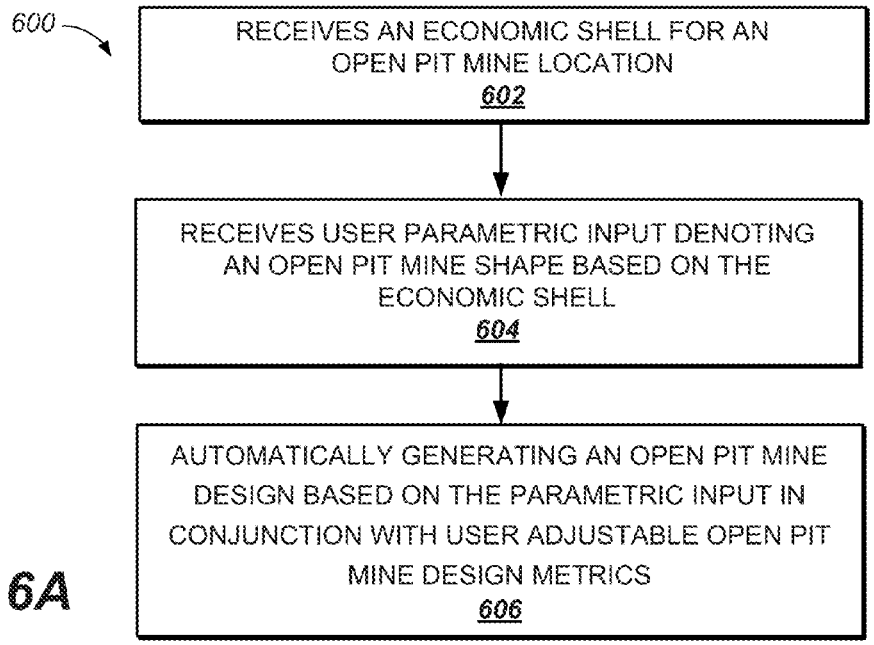
FIG. 6A is a flowchart of a method for an area-based designing of an open pit mine shown in accordance with an embodiment of the present technology.

With reference now to FIG. 6A, a flowchart 600 of a method for an area-based designing of an open pit mine is shown in accordance with an embodiment. In one embodiment, the method can be performed on a computer system such as computer system 700 described in further detail herein.

Referring now to 602 of FIG. 6A and FIG. 1A, one embodiment receives an economic shell 108 for an open pit mine location. As stated herein, the economic shell 108 provides a perfect world open pit mine design. In other words, the economic shell 108 only notes the type of ore deposits 109a, 109b, the ore deposit locations and a standardized slope for achieving the open pit design. Thus, the economic shell 108 illustrates what an open pit mine would look like if the ore and waste was removed without concern of how the actual ore and waste removal occurred. For example, the economic shell usually does not include haul roads, engineering criteria, geological information used to determine the actual slope, or the like.

With reference now to 604 of FIG. 6A and FIG. 5, one embodiment receives user parametric input denoting an open pit mine shape 508 based on the economic shell 108. For example, in one embodiment, a user paints shape 508 on the surface of the economic shell 108. Although painting is discussed herein, shape 508 may be indicated in a number of different methods. For example, the user may draw the outline of shape 508 around the economic shell 108.

In addition, although the shape 508 is discussed as being provided on the surface of the economic shell 108, as discussed in more detail herein, shape 508 may be painted at different depths ranging from the surface to the bottom or deepest layer of the economic shell 108.

Referring now to 606 of FIG. 6A and FIG. 1B, 1C, 1D and 1F, one embodiment automatically generates an open pit mine design based on the parametric input in conjunction with user adjustable open pit mine design metrics. In one embodiment, the user adjustable open pit mine design metrics include metrics such as bench height, berm width, slope angle, ramp width, stack height, stack slope, step out width, switchback haul road information and the like.

Additionally, user adjustable open pit mine design metrics may include mine machinery characteristic such as truck parameters, truck geometry, a slope restriction, a weight restriction, a turning radius, a width of a haul road for a given vehicle and the like. User adjustable open pit mine design metrics may also include geological metrics such as available land, waste dump locations, ore drop locations, geological information for material around the ore, and the like which have been discussed previously. In one embodiment, the user adjustable open pit mine design metrics may be predefined or may be configured during the mine design generation.

For example, if the user paints shape 508 on the surface, open pit mine designer 300 will utilize the user painted area in conjunction with user adjustable open pit mine design metrics to generate an open pit mine design 200. That is, in one embodiment, the open pit mine designer 300 will take the shape 508 designated by the user in conjunction with mine design parameters such as bench height, berm width, slope angle, ramp width, stack height, stack slope, step out width, and switchback haul road information to automatically generate the open pit mine design from the surface down. In another embodiment, if the user paints shape 508 at the lowest point in the economic model, the open pit mine designer 300 will take the shape 508 designated by the user in conjunction with mine design parameters such as bench height, berm width, slope angle, ramp width, stack height, stack slope, step out width, and switchback haul road information to automatically generate the open pit mine design from the bottom up.

In yet another embodiment, if the user paints shape 508 at an elevation between the surface and the lowest point in the economic model, the open pit mine designer 300 will take the shape 508 designated by the user in conjunction with mine design parameters such as bench height, berm width, slope angle, ramp width, stack height, stack slope, step out width, and switchback haul road information to automatically generate the open pit mine design down and up from the defined elevation.

In one embodiment, the haul roads, such as the waste haul road 170 and ore haul road 173, and the associated haul road parameters may be automatically defined during the initial design generation of the open pit mine design. In another embodiment, the initial open pit mine design may be generated without haul roads and once a design is selected, the haul roads and haul road parameters will be automatically added to the open pit mine design.

In one embodiment, open pit mine designer 300 additionally includes a compliance requirement to ensure proper mine design characteristics. For example, in one embodiment painted shape 508 designates the lowest point in the economic shell 108. A compliance requirement may include inflating each layer above the lowest layer 508 until the desired top elevation is reached. In so doing, the compliance requirement will ensure that the open pit mine design will have no overhangs or any other violations to the constraints established by the user-specified parameters in the design.

Thus, by utilizing the area-based design the complexity of the mine design for the user is reduced since the user designate an elevation and shape of the desired open pit mine and then the open pit mine designer 300 will automatically perform the detailed design process as shown and described herein to generate the open pit mine design.

In addition to reducing user complexity, the open pit mine design can be evaluated against user defined design objective metrics such as a minimized amount of waste to be removed, a time frame for obtaining the ore, a maximization of ore obtained, mine machinery requirements and availability, and the like.

Moreover, because of the automatic generation of the open pit mine design, in one embodiment a user can provide a number of different shapes 508 to open pit mine designer 300 and receive a similar number of different open pit mine designs 200. The user can similarly compare and contrast each of the open pit mine designs against the above stated design objective metrics to help select an appropriate open pit mine design.

Figure 6B:
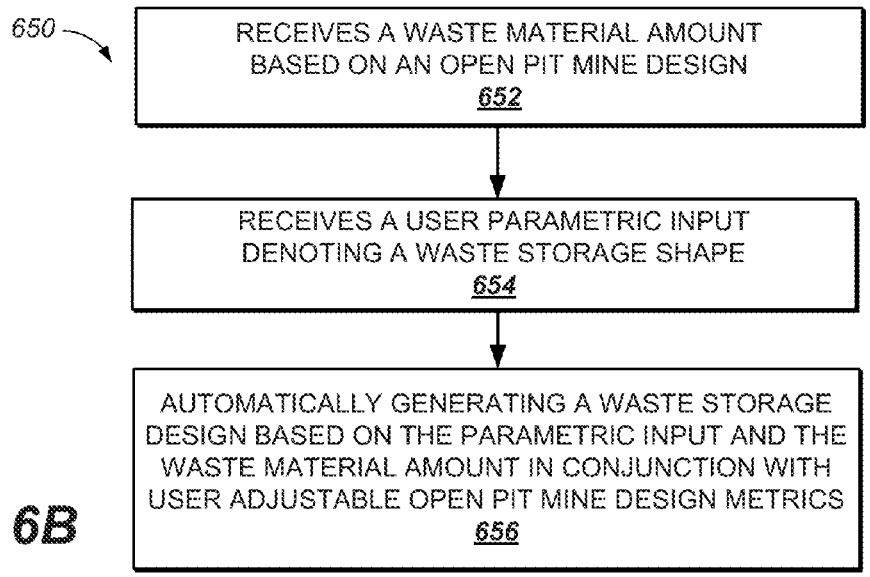
FIG. 6B is a flowchart of a method for automatically developing a waste storage design shown in accordance with one embodiment of the present technology.

With reference now to FIG. 6B, a flowchart 650 of a method for automatically developing a waste storage design is shown in accordance with one embodiment of the present technology. That is, utilizing the same basic functionality described herein, a waste storage design can be automatically developed based on user parametric input.

Referring now to 652 of FIG. 6B and FIG. 2, one embodiment receives a waste material amount based on the open pit mine design. The waste material amount being a measure of the waste material that planned to be removed during the design of the open pit mine With reference now to 654 of FIG. 6B and FIG. 2, one embodiment receives user parametric input denoting a waste storage shape. For example, in one embodiment, a user paints a shape similar to 508 at the desired waste storage location. Although painting is discussed herein, the shape similar to 508 may be indicated in a number of different methods. For example, the user may draw the outline of shape 508 around the economic shell 108.

With reference now to 656 of FIG. 6B and FIGS. 2-3, one embodiment utilizes the parametric input and the waste material amount in conjunction with user adjustable waste storage design metrics to automatically develop a waste storage design.

Examples of the user adjustable waste storage design metrics may include waste material type, consistency, and the like. In addition, user adjustable waste storage design metrics may include environmental parameters such as, but not limited to: storage area fitment requirements such as length of waste pile, width of waste pile and height of waste pile; environmental impact information such as run-off areas, wildlife areas, off-limit areas; geographical information including hills, valleys and waterways; and the like.

Similarly, user adjustable waste storage design metrics may include vehicle characteristics for vehicles that will be delivering the waste. In general, the waste storage design is an inverse of the mine design 508. Thus, the same characteristics that were utilized in developing the mine design are also used to develop the waste storage design, e.g., bench height, berm width, slope angle, ramp width and the like.

For example, the haul road ramp width 158 may be determined by a default of approximately 3.5 times the width of the widest truck to allow passing between ascending and descending vehicles. In one embodiment, the maximum grade slope may be a 10% default. Although a number of defaults values are provided herein, the default values are representative of one embodiment and may be adjusted in different implementations. Moreover, although all of the mine design characteristics are not repeated in the waste design description, any or all of the design characteristics that are applicable to the mine design may be similarly utilized during the waste storage design.

Thus, in one embodiment both the open pit mine design and the waste storage design may be generated and provided to the user at almost the same time.

Similarly, any modifications to the open pit mine design may be automatically carried over to the waste storage design. For example, if an increase in the size of the open pit mine design was contemplated, the user would be able to review the associated larger waste storage design. This information may be economically important if the adjustment to the open pit mine design resulted in a need for a secondary waste storage location or an adjustment to the waste storage design that would require additional permissions, or the like.

Computer System

Figure 7:
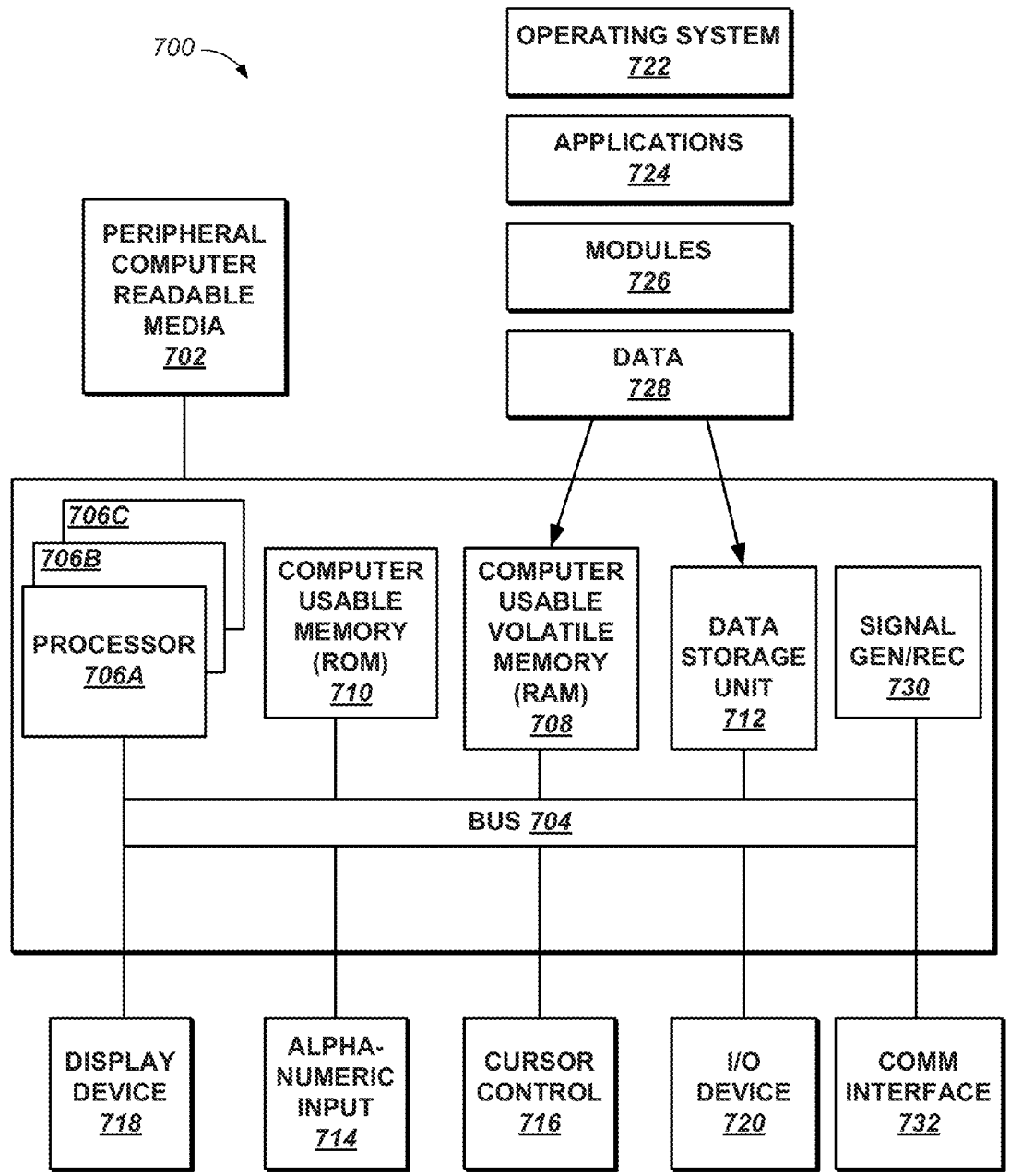
FIG. 7 is a block diagram of an example computer system upon which embodiments of the present technology may be implemented.

With reference now to FIG. 7, portions of the technology for providing a communication composed of computer-readable and computer-executable instructions that reside, for example, in non-transitory computer-usable storage media of a computer system. That is, FIG. 7 illustrates one example of a type of computer that can be used to implement embodiments of the present technology. FIG. 7 represents a system or components that may be used in conjunction with aspects of the present technology. In one embodiment, some or all of the components of FIG. 1A-F or FIG. 3 may be combined with some or all of the components of FIG. 7 to practice the present technology.

FIG. 7 illustrates an example computer system 700 used in accordance with embodiments of the present technology. It is appreciated that system 700 of FIG. 7 is an example only and that the present technology can operate on or within a number of different computer systems including general purpose networked computer systems, embedded computer systems, routers, switches, server devices, user devices, various intermediate devices/artifacts, stand-alone computer systems, mobile phones, personal data assistants, televisions and the like. As shown in FIG. 7, computer system 700 of FIG. 7 is well adapted to having peripheral computer readable media 702 such as, for example, a floppy disk, a compact disc, and the like coupled thereto.

System 700 of FIG. 7 includes an address/data bus 704 for communicating information, and a processor 706A coupled to bus 704 for processing information and instructions. As depicted in FIG. 7, system 700 is also well suited to a multi-processor environment in which a plurality of processors 706A, 706B, and 706C are present. Conversely, system 700 is also well suited to having a single processor such as, for example, processor 706A. Processors 706A, 706B, and 706C may be any of various types of microprocessors. System 700 also includes data storage features such as a computer usable volatile memory 708, e.g. random access memory (RAM), coupled to bus 704 for storing information and instructions for processors 706A, 706B, and 706C.

System 700 also includes computer usable non-volatile memory 710, e.g. read only memory (ROM), coupled to bus 704 for storing static information and instructions for processors 706A, 706B, and 706C. Also present in system 700 is a data storage unit 712 (e.g., a magnetic or optical disk and disk drive) coupled to bus 704 for storing information and instructions. System 700 also includes an optional alphanumeric input device 714 including alphanumeric and function keys coupled to bus 704 for communicating information and command selections to processor 706A or processors 706A, 706B, and 706C. System 700 also includes an optional cursor control device 716 coupled to bus 704 for communicating user input information and command selections to processor 706A or processors 706A, 706B, and 706C. System 700 of the present embodiment also includes an optional display device 718 coupled to bus 704 for displaying information.

Referring still to FIG. 7, optional display device 718 of FIG. 7 may be a liquid crystal device, cathode ray tube, plasma display device or other display device suitable for creating graphic images and alpha-numeric characters recognizable to a user. Optional cursor control device 716 allows the computer user to dynamically signal the movement of a visible symbol (cursor) on a display screen of display device 718. Many implementations of cursor control device 716 are known in the art including a trackball, mouse, touch pad, joystick or special keys on alpha-numeric input device 714 capable of signaling movement of a given direction or manner of displacement. Alternatively, it will be appreciated that a cursor can be directed and/or activated via input from alpha-numeric input device 714 using special keys and key sequence commands.

System 700 is also well suited to having a cursor directed by other means such as, for example, voice commands. System 700 also includes an I/O device 720 for coupling system 700 with external entities. For example, in one embodiment, I/O device 720 is a modem for enabling wired or wireless communications between system 700 and an external network such as, but not limited to, the Internet. A more detailed discussion of the present technology is found below.

Referring still to FIG. 7, various other components are depicted for system 700. Specifically, when present, an operating system 722, applications 724, modules 726, and data 728 are shown as typically residing in one or some combination of computer usable volatile memory 708, e.g. random access memory (RAM), and data storage unit 712. However, it is appreciated that in some embodiments, operating system 722 may be stored in other locations such as on a network or on a flash drive; and that further, operating system 722 may be accessed from a remote location via, for example, a coupling to the internet. In one embodiment, the present technology, for example, is stored as an application 724 or module 726 in memory locations within RAM 708 and memory areas within data storage unit 712. The present technology may be applied to one or more elements of described system 700.

System 700 also includes one or more signal generating and receiving device(s) 730 coupled with bus 704 for enabling system 700 to interface with other electronic devices and computer systems. Signal generating and receiving device(s) 730 of the present embodiment may include wired serial adaptors, modems, and network adaptors, wireless modems, and wireless network adaptors, and other such communication technology. The signal generating and receiving device(s) 730 may work in conjunction with one or more communication interface(s) 732 for coupling information to and/or from system 700. Communication interface 732 may include a serial port, parallel port, Universal Serial Bus (USB), Ethernet port, antenna, or other input/output interface. Communication interface 732 may physically, electrically, optically, or wirelessly (e.g. via radio frequency) couple system 700 with another device, such as a cellular telephone, radio, or computer system.

The computing system 700 is only one example of a suitable computing environment and is not intended to suggest any limitation as to the scope of use or functionality of the present technology. Neither should the computing environment 700 be interpreted as having any dependency or requirement relating to any one or combination of components illustrated in the example computing system 700.

The present technology may be described in the general context of computer-executable instructions, such as program modules, being executed by a computer. Generally, program modules include routines, programs, objects, components, data structures, etc., that perform particular tasks or implement particular abstract data types. The present technology may also be practiced in distributed computing environments where tasks are performed by remote processing devices that are linked through a communications network. In a distributed computing environment, program modules may be located in both local and remote computer-storage media including memory-storage devices.

We claim:

1. A method for an area-based designing of an open pit mine, said method comprising:
   receiving, at a computer system, an economic shell for an open pit mine location;
   receiving, at the computer system, user parametric input denoting an open pit mine shape based on the economic shell, wherein the user parametric input is painted over the economic shell;
   receiving, at the computer system, user adjustable open pit mine design metrics;
   receiving, at the computer system, a current market condition for at least two types of ore;
   automatically generating, at the computer system, an open pit mine design including a location of a haul road, the open pit mine design based on the parametric input, the user adjustable open pit mine design metrics, and the current market condition;
   receiving, at the computer system, an updated market condition for the at least two types of ore; and
   automatically updating, at the computer system, the location of the haul road based on the updated market condition.

2. The method of claim 1 wherein the user adjustable open pit mine design metrics comprise:
   a mine machinery characteristic comprising a weight restriction for a given vehicle; and
   an open pit mine characteristic comprising a step out width and a switchback haul road information;
   said mine machinery characteristic selected from the group consisting of: a truck parameters, a truck geometry, a slope restriction, a turning radius and a width of a haul road for said given vehicle.

3. The method of claim 1 wherein the user adjustable open pit mine design metrics further comprise:
a geological metric selected from the group consisting of: an available land, a waste dump locations, an ore drop locations and a geological information for material around the ore.

4. The method of claim 1 wherein said open pit mine characteristic is selected from the group consisting of: a bench height, a berm width, a slope angle, a ramp width, a stack height, and a stack slope.

5. The method of claim 1 further comprising:
automatically regenerating the open pit mine design when the user adjustable open pit mine design metric is modified.

6. The method of claim 1 further comprising:
receiving the user parametric input for a deepest layer of the open pit mine; and
automatically generating the open pit mine design from the deepest layer to a surface based on the parametric input.

7. The method of claim 1 further comprising:
receiving the user parametric input for a surface layer of the open pit mine; and
automatically generating the open pit mine design from the surface layer to a deepest layer based on the parametric input.

8. The method of claim 1 further comprising:
receiving the user parametric input for a selected depth layer of the open pit mine; and
automatically generating the open pit mine design in both a shallow and a deeper direction from the selected depth layer based on the parametric input.

9. The method of claim 1 further comprising:
evaluating the open pit mine design against design objective metrics selected from the group consisting of: a minimized amount of waste to be removed, a time frame, a maximization of ore obtained and a mine machinery availability.

10. A data processing apparatus for parametric open pit mine design comprising:
a computer-readable memory for storing data and instructions; and
a processor for executing said instructions to perform operations comprising:
receiving an economic shell for an open pit mine location;
receiving user parametric input denoting an open pit mine shape based on the economic shell, wherein the user parametric input is painted over the economic shell;
receiving user adjustable open pit mine design metrics;
receiving, at the computer system, a current market condition for at least two types of ore;
automatically generating an open pit mine design including a location of a haul road, the open pit mine design based on the parametric input, the user adjustable open pit mine design metrics, and the current market condition;
receiving an updated market condition for the at least two types of ore; and
automatically updating the location of the haul road based on the updated market condition.

11. The data processing apparatus of claim 10, wherein said operations further comprise:
receiving environmental information including available land, wherein said environmental information is selected from the group consisting of: a waste dump locations, an ore drop locations and a geological information for material around the ore.

12. The data processing apparatus of claim 10, wherein said operations further comprise:
receiving a open pit mine characteristic, wherein the open pit mine characteristic is selected from the group consisting of: a bench height, a berm width, a slope angle, a ramp width, a stack height, and a stack slope.

13. The data processing apparatus of claim 10, wherein said operations further comprise:
receiving an engineering metric, wherein the engineering metric is selected from the group consisting of: truck parameters, truck geometry and vehicle capability characteristics.

14. The data processing apparatus of claim 13 wherein the vehicle capability characteristics is selected from the group consisting of: a slope restriction, a turning radius and a width of a haul road for said given vehicle.

* * * * *